(12) United States Patent
Aoki et al.

(10) Patent No.: US 11,427,907 B2
(45) Date of Patent: Aug. 30, 2022

(54) GAS SUPPLY APPARATUS AND GAS SUPPLY METHOD

(71) Applicant: SHOWA DENKO K.K., Tokyo (JP)

(72) Inventors: Takanori Aoki, Tokyo (JP); Katsumi Mikami, Kawasaki (JP)

(73) Assignee: SHOWA DENKO K.K., Tokyo (JP)

(*) Notice: Subject to any disclaimer, the term of this patent is extended or adjusted under 35 U.S.C. 154(b) by 547 days.

(21) Appl. No.: 16/318,645

(22) PCT Filed: Jul. 11, 2017

(86) PCT No.: PCT/JP2017/025214
§ 371 (c)(1),
(2) Date: Jan. 17, 2019

(87) PCT Pub. No.: WO2018/016375
PCT Pub. Date: Jan. 25, 2018

(65) Prior Publication Data
US 2019/0292660 A1    Sep. 26, 2019

(30) Foreign Application Priority Data

Jul. 20, 2016 (JP) .............................. JP2016-142652

(51) Int. Cl.
*F17C 9/02* (2006.01)
*C23C 16/448* (2006.01)
*F17C 9/00* (2006.01)

(52) U.S. Cl.
CPC ........ *C23C 16/4485* (2013.01); *C23C 16/448* (2013.01); *F17C 9/00* (2013.01);
(Continued)

(58) Field of Classification Search
CPC ...... F17D 3/01; F17C 9/02; F17C 2205/0352; F17C 2227/0302; F17C 2250/043; F17C 2250/0439; F17C 2270/0518
See application file for complete search history.

(56) References Cited

U.S. PATENT DOCUMENTS 3,031,887 A * 5/1962 Weisend ................. G01F 23/22
73/295
6,076,359 A * 6/2000 Jurcik ...................... F17C 7/04
62/50.2
(Continued)

FOREIGN PATENT DOCUMENTS

CN    101230948 A    7/2008
CN    105316657 A    2/2016
(Continued)

OTHER PUBLICATIONS

Office Action of Taiwanese Application 106123430, dated Sep. 10, 2018.
(Continued)

*Primary Examiner* — Stephen J Castellano
(74) *Attorney, Agent, or Firm* — Sughrue Mion, PLLC (57) ABSTRACT

Provided is a gas supply apparatus for supplying a gas compound obtained by vaporizing a liquid compound to a target location, the gas supply apparatus comprising: a storage vessel capable of storing the liquid compound; a gas compound supply pipeline, one end of which is connected to the storage vessel, and another end of which is capable of being disposed at the target location; and a temperature control device configured to adjust a temperature of the gas compound or the liquid compound within the storage vessel to be equal to or lower than a surrounding temperature of the gas compound supply pipeline.

8 Claims, 2 Drawing Sheets

(52) U.S. Cl.
CPC ........ *F17C 9/02* (2013.01); *F17C 2205/0352* (2013.01); *F17C 2227/0302* (2013.01); *F17C 2250/043* (2013.01); *F17C 2250/0439* (2013.01); *F17C 2270/0518* (2013.01)

(56) References Cited

U.S. PATENT DOCUMENTS

| | | | |
|---|---|---|---|
| 6,581,623 B1* | 6/2003 | Carpenter | B01D 53/0454 137/113 |
| 2001/0015316 A1 | 8/2001 | Borzio et al. | |
| 2002/0124575 A1* | 9/2002 | Pant | F17C 13/026 62/50.1 |
| 2011/0225986 A1* | 9/2011 | Germond | F17C 9/02 62/50.2 |
| 2014/0290790 A1* | 10/2014 | Mathison | F17C 5/007 141/4 |
| 2016/0032453 A1 | 2/2016 | Qian et al. | |

FOREIGN PATENT DOCUMENTS

| | | |
|---|---|---|
| EP | 1 167 862 A2 | 1/2002 |
| JP | 01-60938 B2 | 12/1989 |
| JP | 4-132300 U | 12/1992 |
| JP | 1323001992 * | 12/1992 |
| JP | 07-161638 A | 6/1995 |
| JP | 2001-023974 A | 1/2001 |
| JP | 2003-268551 A | 9/2003 |
| JP | 2003-332327 A | 11/2003 |
| JP | 2008-172184 A | 7/2008 |
| JP | 2009-72779 A | 4/2009 |
| JP | 2013-113151 A | 6/2013 |
| TW | I490364 B | 7/2015 |
| TW | I509380 B | 11/2015 |
| TW | I534863 B | 5/2016 |

OTHER PUBLICATIONS

International Search Report for PCT/JP2017/025214 dated Sep. 26, 2017 [PCT/ISA/210].
Machine translation of JP 4-132300 U published Dec. 7, 1992 and cited in ISR for PCT/JP2017/025214 dated Sep. 26, 2017.
Communication dated Jun. 2, 2020, from the State Intellectual Property Office of the P.R. of China in Application No. 201780044746.4.
Communication dated Feb. 21, 2020 from the European Patent Office in application No. 17830895.3.

* cited by examiner

GAS SUPPLY APPARATUS AND GAS SUPPLY METHOD

CROSS REFERENCE TO RELATED APPLICATIONS

This application is a National Stage of International Application No. PCT/JP2017/025214 filed Jul. 11, 2017, claiming priority based on Japanese Patent Application No. 2016-142652 filed Jul. 20, 2016.

TECHNICAL FIELD

The present invention relates to a gas supply apparatus and a gas supply method for supplying a gas compound obtained by vaporizing a liquid compound to a target location.

BACKGROUND ART

When a thin film is produced using a chemical vapor deposition (CVD) apparatus, a raw material in the form of a gas is supplied to the CVD apparatus. Also, when a thin film or the like is etched using an etching apparatus, an etching agent in the form of a gas is supplied to the etching apparatus.

In the case where the raw material and the etching agent are liquids, the liquids are vaporized before being supplied to the CVD apparatus, the etching apparatus, and the like. Various technologies for vaporizing and supplying liquids to various apparatuses are known.

For example, PTL 1 discloses a raw material supplying apparatus for a CVD apparatus that vaporizes a raw material in the liquid phase and supplies the resulting raw material to a depositing/synthesizing apparatus, and the raw material supplying apparatus comprises a vacuum generator disposed downstream from a raw material vessel, and gas introducing means that introduces a carrier gas from inside the vacuum generator into a pipeline located downstream from the vacuum generator.

PTL 2 discloses an apparatus that sends a carrier gas to a sealed vessel containing a liquid organometallic compound and supplies the liquid organometallic compound together with the carrier gas.

PTL 3 discloses a vaporization and supply method that includes heating and vaporizing a raw material to supply the raw material to a gas flow rate controller, and supplying the raw material to semiconductor manufacturing equipment without entrained gases while controlling a flow rate using the gas flow rate controller.

In addition, it is known that hexafluorobenzene is used as an etching gas (PTLs 4 and 5).

CITATION LIST

Patent Literature

PTL1: JP 2003-268551 A
PTL2: JP 1107-161638 A
PTL3: JP 2003-332327 A
PTL4: JP H01-60938 B
PTL5: JP 2008-172184 A

SUMMARY OF INVENTION

Technical Problem

In the case where a raw material is vaporized by heating as disclosed in PTL 1, there is the problem that the vaporized raw material gas is cooled and condensed within a transport pipeline while being supplied to the CVD apparatus and blocks the pipeline. For this reason, a line heater is laid along the transport pipeline in PTL 1 to prevent adhesion of the raw material to the inside of the pipeline. However, installation costs and operating costs for the heater are required, and in some cases the condensation cannot be prevented.

In the case where a carrier gas is bubbled through a raw material liquid as disclosed in PTL 2, there is the problem that the amount of the raw material gas to be supplied is unstable.

In the case where a raw material vessel is heated with a heater or the like as disclosed in PTL 3, similarly to the case of PTL 1, there is the problem that the vaporized raw material gas is cooled and condensed within a transport pipeline while being supplied to the semiconductor manufacturing equipment and blocks the pipeline.

The present invention has been made in view of the above problems and provides a gas supply apparatus and a gas supply method that can supply a liquid compound while avoiding condensation within a pipeline without requiring a carrier gas regardless of whether the pipeline is provided with means for preventing condensation, such as a heater.

Solution to Problem

The present inventors have conducted diligent examinations and found that the above problems can be solved by adjusting the temperature of a liquid compound or a gas compound obtained by vaporizing the liquid compound within a storage vessel to be equal to or lower than the surrounding temperature of a gas compound supply pipeline.

Specifically, the present invention relates to [1] to [21] below.

[1] A gas supply apparatus for supplying a gas compound obtained by vaporizing a liquid compound to a target location, the gas supply apparatus comprising: a storage vessel capable of storing the liquid compound; a gas compound supply pipeline, one end of which is connected to the storage vessel, and another end of which is capable of being disposed at the target location; and a temperature control device configured to adjust a temperature of the gas compound or the liquid compound within the storage vessel to be equal to or lower than a surrounding temperature of the gas compound supply pipeline.

[2] The gas supply apparatus as set forth above in [1], wherein the temperature control device comprises: a liquid temperature measuring device configured to measure the temperature of the liquid compound within the storage vessel; and a heat transfer device configured to receive a signal relating to the temperature measured by the liquid temperature measuring device to give or receive heat to or from the storage vessel so as to adjust the measured temperature to be equal to or lower than the surrounding temperature of the gas compound supply pipeline.

[3] The gas supply apparatus as set forth above in [1] or [2], wherein the temperature control device comprises: a gas temperature measuring device configured to measure the temperature of the gas compound within the storage vessel; and a heat transfer device configured to receive a signal relating to the temperature measured by the gas temperature measuring device to give or receive heat to or from the storage vessel so as to adjust the measured temperature to be equal to or lower than the surrounding temperature of the gas compound supply pipeline.

[4] The gas supply apparatus as set forth above in any of [1] to [3], wherein the temperature control device comprises: a pressure measuring device configured to measure a pressure of the gas compound within the storage vessel; and a heat transfer device configured to receive a signal relating to the pressure measured by the pressure measuring device to give or receive heat to or from the storage vessel so as to adjust the measured pressure to be equal to or lower than a saturated vapor pressure of the gas compound at a temperature equal to the surrounding temperature of the gas compound supply pipeline.

[5] The gas supply apparatus as set forth above in any of [1] to [4], the gas supply apparatus further comprising a surrounding temperature measuring device configured to measure the surrounding temperature of the gas compound supply pipeline and send a signal relating to the surrounding temperature to the heat transfer device.

[6] The gas supply apparatus as set forth above in any of [1] to [5], wherein the storage vessel comprises: a storage vessel body; and a connecting pipeline connecting a gas compound containing region of the storage vessel body to the gas compound supply pipeline, and wherein the connecting pipeline is inclined upward relative to the horizontal from a storage vessel body side to a gas compound supply pipeline side.

[7] The gas supply apparatus as set forth above in any of [1] to [6], wherein a mass flow controller is disposed midway of the gas compound supply pipeline.

[8] The gas supply apparatus as set forth above in any of [1] to [7], wherein a pressure of the gas compound within the storage vessel is higher than a pressure in the target location.

[9] The gas supply apparatus as set forth above in any of [1] to [8], the gas supply apparatus further comprising a casing or a housing chamber accommodating the storage vessel, the temperature control device, and the gas compound supply pipeline.

[10] The gas supply apparatus as set forth above in [9], wherein the casing or the housing chamber comprises an air conditioning device configured to control a temperature of an interior space of the casing or the housing chamber.

[11] A gas supply method for supplying a gas compound obtained by vaporizing a liquid compound stored in a storage vessel to a target location through a gas compound supply pipeline, the gas supply method comprising adjusting a temperature of the liquid compound or the gas compound within the storage vessel to be equal to or lower than a surrounding temperature of the gas compound supply pipeline.

[12] The gas supply method as set forth above in [11], the gas supply method comprising a following initial operation step:
Initial operation step: cooling the storage vessel to adjust the temperature of the liquid compound or the gas compound within the storage vessel to be equal to or lower than the surrounding temperature of the gas compound supply pipeline and then supplying the gas compound within the storage vessel to the target location through the gas compound supply pipeline.

[13] The gas supply method as set forth above in [11] or [12], the gas supply method comprising a following steady operation step:
Steady operation step: supplying the gas compound within the storage vessel to the target location through the gas compound supply pipeline and supplying thermal energy to the storage vessel to compensate thermal energy consumed by vaporization of the liquid compound.

[14] The gas supply method as set forth above in any of [11] to [13], the gas supply method comprising adjusting the temperature of the liquid compound or the gas compound within the storage vessel to be within a set temperature range, wherein an upper limit of the set temperature range is a specific value equal to or lower than the surrounding temperature of the gas compound supply pipeline.

[15] The gas supply method as set forth above in [14], the gas supply method comprising cooling the storage vessel when the temperature of the liquid compound or the gas compound within the storage vessel has reached the upper limit of the set temperature range.

[16] The gas supply method as set forth above in [14] or [15], wherein the upper limit of the set temperature range is a specific value within a range of 5 to 40° C., wherein a lower limit of the set temperature range is a specific value within a range of 5 to 40° C., wherein a boiling point of the liquid compound at the gas pressure within the storage vessel is higher than the upper limit, and wherein a melting point of the liquid compound at the gas pressure within the storage vessel is lower than the lower limit.

[17] The gas supply method as set forth above in any of [11] to [16], the gas supply method comprising: measuring the temperature of the liquid compound stored in the storage vessel; and giving or receiving heat to or from the liquid compound based on the measured temperature to adjust the measured temperature of the liquid compound to be within a set temperature range, wherein an upper limit of the set temperature range is a specific value equal to or lower than the surrounding temperature of the gas compound supply pipeline.

[18] The gas supply method as set forth above in any of [11] to [17], the gas supply method comprising: measuring the temperature of the gas compound present in the storage vessel; and giving or receiving heat to or from the liquid compound based on the measured temperature to adjust the measured temperature of the gas compound to be within a set temperature range, wherein an upper limit of the set temperature range is a specific value equal to or lower than the surrounding temperature of the gas compound supply pipeline.

[19] The gas supply method as set forth above in any of [11] to [18], the gas supply method comprising: measuring a pressure of the gas compound present in the storage vessel; and controlling giving and receiving of heat to and from the liquid compound so as to adjust the pressure of the gas compound present in the storage vessel to be equal to or lower than a saturated vapor pressure of the liquid compound at a temperature set to be equal to the surrounding temperature of the gas compound supply pipeline, to thereby adjust the measured temperature of the gas compound or the liquid compound to be within a set temperature range.

[20] The gas supply method as set forth above in any of [11] to [19], wherein the gas supply apparatus as set forth above in any of [1] to [10] is used.

[21] The gas supply method as set forth above in any of [11] to [20], wherein the target location is a CVD apparatus or an etching apparatus.

Advantageous Effects of Invention

The present invention can provide a gas supply apparatus and a gas supply method that can supply a liquid compound while avoiding condensation within a pipeline without requiring a carrier gas regardless of whether the pipeline is provided with means for preventing condensation, such as a heater.

Description of Embodiments

A gas supply apparatus according to the present embodiment is a gas supply apparatus for supplying a gas compound obtained by vaporizing a liquid compound to a target location, the gas supply apparatus comprising: a storage vessel capable of storing the liquid compound; a gas compound supply pipeline, one end of which is connected to the storage vessel, and another end of which is capable of being disposed at the target location; and a temperature control device configured to adjust the temperature of the gas compound or the liquid compound within the storage vessel to be equal to or lower than the surrounding temperature (such as below the surrounding temperature) of the gas compound supply pipeline.

The gas supply apparatus can adjust the temperature of the gas compound or the liquid compound within the storage vessel to be equal to or lower than the surrounding temperature (such as below the surrounding temperature) of the gas compound supply pipeline. Hence, the gas compound with a temperature lower than the surrounding temperature of the gas compound supply pipeline is heated while flowing through the gas compound supply pipeline. This constitution makes the environment within the gas compound supply pipeline be less apt to cause condensation than the environment within the storage vessel, thereby preventing the gas compound within the storage vessel from being condensed while flowing through the supply pipeline.

To maintain a large amount of the gas compound to be supplied, the difference between the temperature of the liquid compound within the storage vessel and the surrounding temperature of the gas compound supply pipeline is preferably within 10° C., more preferably within 5° C. The difference between the temperature of the liquid compound within the storage vessel and the surrounding temperature of the gas compound supply pipeline is preferably 0 to 10° C., more preferably 1 to 10° C., in a case 2 to 10° C., in another case 2 to 8° C., in still another case 3 to 5° C.

The temperature control device may comprise a liquid temperature measuring device configured to measure the temperature of the liquid compound within the storage vessel, and a heat transfer device configured to receive a signal relating to the temperature measured by the liquid temperature measuring device to give or receive heat to or from the storage vessel so as to adjust the measured temperature to be equal to or lower than the surrounding temperature (such as below the surrounding temperature) of the gas compound supply pipeline.

By controlling the heat transfer device on the basis of the temperature of the liquid compound within the storage vessel as described above, the temperature of the liquid compound within the storage vessel is more stably controlled.

The temperature control device may comprise a gas temperature measuring device configured to measure the temperature of the gas compound within the storage vessel, and a heat transfer device configured to receive a signal relating to the temperature measured by the gas temperature measuring device to give or receive heat to or from the storage vessel so as to adjust the measured temperature to be equal to or lower than the surrounding temperature (such as below the surrounding temperature) of the gas compound supply pipeline.

The temperature control device may comprise a pressure measuring device configured to measure the pressure of the gas compound within the storage vessel, and a heat transfer device configured to receive a signal relating to the pressure measured by the pressure measuring device to give or receive heat to or from the storage vessel so as to adjust the measured pressure to be equal to or lower than the saturated vapor pressure (such as below the saturated vapor pressure) of the gas compound at a temperature equal to the surrounding temperature of the gas compound supply pipeline.

To adjust the pressure of the gas compound within the storage vessel to be equal to or lower than the saturated vapor pressure (such as below the saturated vapor pressure) of the gas compound at the temperature equal to the surrounding temperature of the gas compound supply pipeline, it is required that the temperature of the gas compound within the storage vessel be lower than the surrounding temperature of the gas compound supply pipeline. Hence, the temperature control device can make the temperature of the gas compound within the storage vessel lower than the surrounding temperature of the gas compound supply pipeline by controlling the pressure of the gas compound within the storage vessel. This constitution prevents the gas compound within the storage vessel from being condensed while flowing through the supply pipeline.

The gas supply apparatus may comprise a surrounding temperature measuring device configured to measure the surrounding temperature of the gas compound supply pipeline and send a signal relating to the surrounding temperature to the temperature control device.

This constitution can adjust the temperature of the gas compound or the liquid compound within the storage vessel to be equal to or lower than the surrounding temperature (such as below the surrounding temperature) of the gas compound supply pipeline even in the case where the surrounding temperature of the gas compound supply pipeline fluctuates.

The storage vessel may comprise a storage vessel body and a connecting pipeline connecting a gas compound containing region of the storage vessel body to the gas compound supply pipeline, and the connecting pipeline may be inclined upward relative to the horizontal from the storage vessel body side to the gas compound supply pipeline side.

Even if part of the gas compound is condensed within the connecting pipeline to become the liquid compound, the above constitution prevents clogging of the connecting pipeline because the liquid compound runs down along the inclination of the connecting pipeline into the storage vessel.

A mass flow controller may be disposed midway of the gas compound supply pipeline. This constitution enables precise control of the amount of the gas compound to be supplied to the target location.

The pressure of the gas compound within the storage vessel is preferably higher than the pressure in the target location. The gas compound within the storage vessel is supplied to the target location using this difference in pressure.

The gas supply apparatus according to the present embodiment preferably comprises a casing or a housing chamber accommodating the storage vessel, the temperature control device, and the gas compound supply pipeline. This constitution enables precise control of the temperature or pressure of the gas compound or the liquid compound within the storage vessel.

The casing or the housing chamber preferably comprises an air conditioning device configured to control the temperature of the interior space of the casing or the housing chamber. This constitution prevents the surrounding temperature of the gas compound supply pipeline from greatly fluctuating.

A gas supply method according to the present embodiment is a gas supply method for supplying a gas compound obtained by vaporizing a liquid compound stored in a storage vessel to a target location through a gas compound supply pipeline, the gas supply method comprising adjusting a temperature of the liquid compound or the gas compound within the storage vessel to be equal to or lower than a surrounding temperature (such as below the surrounding temperature) of the gas compound supply pipeline.

The gas supply method can adjust the temperature of the gas compound or the liquid compound within the storage vessel to be equal to or lower than the surrounding temperature (such as below the surrounding temperature) of the gas compound supply pipeline. This constitution prevents the gas compound within the storage vessel from being condensed while flowing through the supply pipeline.

The gas supply method according to the present embodiment may comprise the following initial operation step:

Initial operation step: cooling the storage vessel to adjust the temperature of the liquid compound or the gas compound within the storage vessel to be equal to or lower than the surrounding temperature (such as below the surrounding temperature) of the gas compound supply pipeline and then supplying the gas compound within the storage vessel to the target location through the gas compound supply pipeline.

That is, before starting operation, the vapor liquid equilibrium is established within the storage vessel because the liquid compound is sealed in the storage vessel. Accordingly, drops in the temperature within the storage vessel due to vaporization of the liquid compound do not occur. Hence, the temperature within the storage vessel is considered to be about the same as the surrounding temperature of the gas compound supply pipeline at the start of operation. Hence, blocking of the gas compound supply pipeline is certainly prevented by cooling the storage vessel to adjust the temperature of the liquid compound or the gas compound within the storage vessel to be equal to or lower than the surrounding temperature (such as below the surrounding temperature) of the gas compound supply pipeline at the start of operation and then supplying the gas compound to the target location.

The gas supply method according to the present embodiment may comprise the following steady operation step:

Steady operation step: supplying the gas compound within the storage vessel to the target location through the gas compound supply pipeline and supplying thermal energy to the storage vessel to compensate thermal energy consumed by vaporization of the liquid compound.

That is, in the steady operation step, the gas compound within the storage vessel is supplied to the target location, and the same amount of the liquid compound as the amount of the gas compound supplied is vaporized. Since the vaporization of the liquid compound consumes thermal energy, the same amount of thermal energy is supplied to the storage vessel to keep the temperatures of the gas compound and the liquid compound within the storage vessel constant. Drops in the amount of the gas compound to be supplied to the target location due to drops in the temperatures of the gas compound and the liquid compound within the storage vessel is thus prevented.

The gas supply method according to the present embodiment may be the gas supply method comprising adjusting the temperature of the liquid compound or the gas compound within the storage vessel to be within a set temperature range, wherein the upper limit of the set temperature range is a specific value equal to or lower than the surrounding temperature (such as below the surrounding temperature) of the gas compound supply pipeline.

In this case, blocking of the gas compound supply pipeline is certainly prevented by increasing the difference between the upper limit of the set temperature range and the surrounding temperature of the gas compound supply pipeline. Also, the amount of the gas compound to be supplied to the target location is increased by reducing the difference in temperature.

In addition, supplying the gas compound within the storage vessel to the target location vaporizes the liquid compound within the storage vessel to generate the same amount of the gas compound as the amount supplied to the target location. The temperature within the storage vessel decreases because of the heat of vaporization at this time.

Hence, when the temperature of the liquid compound or the gas compound within the storage vessel has reached the upper limit of the set temperature range, the temperature of the liquid compound or the gas compound within the storage vessel is brought back into the set temperature range (such as below the upper limit of the set temperature) by supplying a smaller amount of thermal energy to the storage vessel than the amount of heat of vaporization.

The storage vessel may be cooled when the temperature of the liquid compound or the gas compound within the storage vessel has reached the upper limit of the set temperature range. The temperature of the liquid compound or the gas compound within the storage vessel is thus brought back into the set temperature range earlier, so that blocking of the gas compound supply pipeline is more certainly prevented.

It is preferable to first cool the storage vessel at the start of operation, adjust the temperature of the liquid compound or the gas compound within the storage vessel to be within the set temperature range (such as below the upper limit of the set temperatures), and then supply the gas compound within the storage vessel to the target location. With this constitution, the temperature of the liquid compound or the gas compound within the storage vessel can be adjusted to be within the set temperature range, which is equal to or lower than the surrounding temperature (such as below the surrounding temperature) of the gas compound supply pipeline, even at the start of operation (early stage of operation). Hence, blocking of the gas compound supply pipeline when the gas compound within the storage vessel is supplied to the gas compound supply pipeline is prevented.

The upper limit of the set temperature range may be a specific value within the range of 5 to 40° C., the lower limit of the set temperature range may be a specific value within the range of 5 to 40° C., the boiling point of the liquid compound at a gas pressure within the storage vessel may be higher than the upper limit, and the melting point of the liquid compound at the gas pressure within the storage vessel may be lower than the lower limit.

With this constitution, the liquid compound that is in a liquid state at around room temperature, that is, at 5 to 40° C., can be supplied to the target location.

The gas supply method according to the present embodiment may be the gas supply method comprising measuring the temperature of the liquid compound stored in the storage vessel, and giving or receiving heat to or from the liquid compound on the basis of the measured temperature to adjust the temperature of the liquid compound to be within a set temperature range, wherein the upper limit of the set temperature range is a specific value equal to or lower than the surrounding temperature (such as below the surrounding temperature) of the gas compound supply pipeline.

The temperature is controlled on the basis of the measured temperature of the liquid compound out of the liquid compound and the gas compound within the storage vessel as described above, so that the control can be more stably performed.

The gas supply method according to the present embodiment may be the gas supply method comprising measuring the temperature of the gas compound present in the storage vessel, and giving or receiving heat to or from the liquid compound on the basis of the measured temperature to adjust the temperature of the gas compound to be within a set temperature range, wherein the upper limit of the set temperature range is a specific value equal to or lower than the surrounding temperature (such as below the surrounding temperature) of the gas compound supply pipeline.

The gas supply method according to the present embodiment may be the gas supply method comprising measuring the pressure of the gas compound present in the storage vessel, and controlling giving and receiving of heat to and from the liquid compound so as to adjust the pressure of the gas compound present in the storage vessel to be equal to or lower than the saturated vapor pressure of the liquid compound at a temperature set to be equal to the surrounding temperature of the gas compound supply pipeline to adjust the measured temperature of the gas compound or the liquid compound to be within a set temperature range.

A combination of two or more methods may be used from among the method comprising adjusting the temperature of the gas compound within the storage vessel to be equal to or lower than the surrounding temperature (such as below the surrounding temperature) of the gas compound supply pipeline on the basis of the measurement result of the pressure of the gas compound present in the storage vessel as described above, the method comprising adjusting the temperature of the liquid compound within the storage vessel to be equal to or lower than the surrounding temperature (such as below the surrounding temperature) of the gas compound supply pipeline on the basis of the measurement result of the temperature of the liquid compound present in the storage vessel as described above, and the method comprising adjusting the temperature of the gas compound within the storage vessel to be equal to or lower than the surrounding temperature (such as below the surrounding temperature) of the gas compound supply pipeline on the basis of the measurement result of the temperature of the gas compound present in the storage vessel. The combination more certainly prevents condensation of the gas compound within the gas compound supply pipeline.

The gas supply method according to the present embodiment is preferably performed using the above gas supply apparatus.

The above target location is preferably a CVD apparatus or an etching apparatus.

The liquid compound applied to the gas supply apparatus and the gas supply method according to the present embodiment is not limited to particular compounds. Examples of the liquid compound include halogen-containing compounds; aliphatic compounds; aromatic compounds; epoxy compounds; ether compounds; nitrile compounds; aldehyde compounds; carboxylic acid compounds; ester compounds; amine compounds; nitrogen oxides; water; alcohol compounds; ketone compounds; compounds containing group 4-12 metals; boron compounds, which belong to group 13 element compounds; aluminum compounds; gallium compounds; indium compounds; silicon compounds, which belong to compounds containing group 14 elements; germanium compounds; tin compounds; lead compounds; phosphorus compounds, which belong to compounds containing group 15 elements; arsenic compounds; antimony compounds; sulfur compounds, which belong to compounds containing group 16 elements; and selenium compounds.

The melting point of the liquid compound is preferably equal to or lower than 40° C., more preferably equal to or lower than 20° C., further preferably equal to or lower than 5° C. If the melting point is equal to or lower than 5° C., the liquid compound can be handled as a liquid at room temperature (25° C.), and the liquid compound can be kept in a liquid state when the liquid compound is adjusted to have a temperature equal to or lower than the surrounding temperature (such as below the surrounding temperature), so that a stable vapor pressure can be obtained.

The saturated vapor pressure of the liquid compound at room temperature (25° C.) is preferably equal to or higher than 0.1 kPa, more preferably equal to or higher than 1 kPa, further preferably equal to or higher than 5 kPa. Also, the saturated vapor pressure is preferably equal to or lower than 200 kPa, more preferably equal to or lower than 150 kPa, further preferably equal to or lower than 100 kPa. If the saturated vapor pressure is equal to or higher than 200 kPa, the compound is likely to exist not as a liquid but as a gas. If the saturated vapor pressure is equal to or lower than 0.1 kPa, it is difficult to supply the compound as a gas because the vapor pressure is low.

In view of the above, specific examples of the halogen-containing compounds used as the liquid compound that can be applied to the present embodiment include 1-fluorobutane, 1-fluoroheptane, 1-fluorohexane, 1-fluoroheptane, 1-fluorooctane, 1-fluorononane, 1-fluorodecane, octafluorocyclopentene, enflurane, Fluothane, fluorobenzene, m-fluorophenetole, mesityl fluoride, 1-ethyl-4-fluorobenzene, 1-fluoro-2,3-dimethoxybenzene, 1,2-difluorobenzene, 1,3-difluorobenzene, 1,4-difluorobenzene, 4-fluorobenzenethiol, 2,4-difluorobenzenethiol, 2,5-difluoroaniline, benzotrifluoride, 4-aminobenzotrifluoride, 4-bromobenzotrifluoride, 2,5-difluorobenzotrifluoride, 3,4-difluorobenzotrifluoride, 2,5-difluorobenzyl cyanide, 2,4-difluorobenzylamine, 3,4-difluoroaniline, 2,4-difluoroanisole, 2,5-difluorobenzylamine, 2,4-difluorotoluene, 2,6-difluorobenzylamine, 2,6-thfluorobenzeneacetonitrile, 3,4-difluoronitrobenzene, 2,4-difluoroaniline, 3,4-difluorobenzyl cyanide, 1,2,3-trifluorobenzene, 1,2,4-trifluorobenzene, 1-chloro-2,4,6-trifluorobenzene, 5-ethynyl -1,2,3-trifluorobenzene, 2, 3,4-trifluoroaniline, 1,3,5-trifluorobenzene, 1,2,3,4- tetrafluorobenzene, 1,2,3,5-tetrafluorobenzene, 1,2,4,5-tetrafluorobenzene, 2,3,5,6-tetrafluorobenzenethiol, 1,2-dibromo-3,4,5,6-tetrafluorobenzene, 2,3,5,6-tetrafluorobenzotrifluoride, 1,2,3,4-tetrafluoro-5-nitrobenzene, 1,3,4,5-tetrafluoro -2-nitrobenzene, pentafluorobenzene, octafluorotoluene, pentafluoroanisole, 2,3,4,5,6-pentafluorotoluene, 2,3,4,5,6-pentafluoro-1-(chloromethyl)benzene, 2,3,4,5,6-pentafluorostyrene, trimethylpentafluorophenylsilane, perfluoropropyl vinyl ether, hexafluoropropylene oxide, hexafluorobenzene, 1,3,3,3-tetrafluoro-1-methoxy-2-trifluoromethyl -2-propene, 2-(perfluorobutyl ethanol, 2-(perfluorohexyl)ethanol, 2-(perfluorobutyl)ethyl acrylate, 2-(perfluorohexyl)ethyl acrylate, 2-(perfluorobutyl)ethyl methacrylate, 2-(perfluorohexyl)ethyl methacrylate, perfluorobutylethylene, perfluorohexylethylene, 3-(perfluorobutyl) 1-propene, 3-(perfluorohexyl-1-propene, 3-(perfluorobutyl)propene-1,2-oxide, 3-(perfluorohexyl)propene-1,2-oxide, 2-(perfluorohexyl)ethyl vinyl ether, perfluorotributylamine, perfluoropentane, perfluorohexane, perfluoroheptanoic acid, chlorine trifluoride, 2,5-dichlorofluorobenzene, 1,3-dichloro-2,4,5,6-tetrafluorobenzene, chloropentafluorobenzene, 3-chlorofluorobenzene, 2,4-dichlorofluorobenzene, 2-chloro-1,4-difluorobenzene, 2-chloro-1,3-difluorobenzene, 1-chloro-3,4-difluorobenzene, 3,4-dichlorobenzotrifluoride, bromine pentafluoride, 1,3-dibromo-5-fluorobenzene, 3-bromofluorobenzene, 1-bromo-2,3,5-trifluorobenzene, 1-bromo-2,3,5-trifluorobenzene, 1-bromo-2,4,6-trifluorobenzene, 1-bromo-3,4,5-trifluorobenzene, 1-bromo-2,4,5-trifluorobenzene, 1,3-dibromotetrafluorobenzene, pentafluorobenzyl bromide, bromopentafluorobenzene, 2-bromofluorobenzene, 3-fluorobenzal bromide, 2,3,5,6-tetrafluorobenzyl bromide, 1-bromo-2,6-difluorobenzene, 1-bromo-2,5-difluorobenzene, 3,4-difluorobenzyl bromide, 1-bromo-3,5-difluorobenzene, 1-bromo -2,3,5,6-tetrafluorobenzene, 1-bromo-2,3,4,5-tetrafluorobenzene, difluorodibromomethane, 4-bromofluorobenzene, iodine heptafluoride, iodine pentafluoride, pentafluoroiodobenzene, 2,6-difluoro-1-iodobenzene, 1-chloroethane, 1-chloropropane, allyl chloride, 1-chlorobutane, 1-chloropentane, 1-chlorohexane, 1-chloroheptane, 1-chlorooctane, 1-chlorononane, 1-chlorodecane, trichloromethane, 1,1-dichloroethane, 1,2-dichloroethane, 1,1-dichloroethylene, dichloromethane, cis-1,2-dichloroethylene, trans-1,2-dichloroethylene, isopropyl chloride, chlorobenzene, 1,2-dichlorobenzene, 1,2,4-trichlorobenzene, dibromomethane, 1-bromoethane, 1-bromopropane, 1-bromoisopropane, allyl bromide, 1-bromobutane, 1-bromoisobutane, 1-bromopentane, 1-bromohexane, cyclohexyl bromide, 1-bromoheptane, 1-bromooctane, 1-bromononane, 1-bromodecane, 2-ethylhexyl bromide, 2-bromoethyl methyl ether, bromobenzene, 5-bromo-m-xylene, 4-bromo-m-xylene, o-bromotoluene, 1,6-dibromohexane, p-bromoanisole, β-bromoethylbenzene, 2-bromopyridine, 3-bromopyridine, 2-bromothiophene, 3,4-dibromothiophene, 1-bromo-2-iodobenzene, 1-bromo-3-iodobenzene, iodomethane, 1-iodoethane, 1-iodopropane, 1-iodoisopropane, 1-iodobutane, 1-iodoisobutane, 1-iodopentane, 1-iodoisopentane, 1-iodohexane, 1-iodoheptane, 1-iodooctane, 1-iodononane, 1-iododecane, iodobenzene, 2-iodotoluene, 3-iodotoluene, 4-iodo-m-xylene, diiodomethane, and 3-iodoaniline.

Specific examples of the aliphatic compounds used as the liquid compound that can be applied to the present embodiment include 2-methyl-1,3-butadiene, 2-methylbutane, cyclohexane, cyclohexene, cis-2-hexene, trans-2-hexene, normal hexane, normal heptane, normal pentane, 1-hexene, 1-pentene, 3-methyl-1-butene, 1-pentadecene, and 2-ethyl-1-butene. Examples of the aromatic compounds include ethylbenzene, o-xylene, styrene, toluene, p-xylene, benzene, m-xylene, and ethynylbenzene. Examples of the epoxy compounds include ethylene oxide, propylene oxide, 1,2-butylene oxide, 2,3-butylene oxide, cyclohexene oxide, styrene oxide, glycidol, epichlorohydrin, and 3-chlorooxetane.

Specific examples of the ether compounds used as the liquid compound that can be applied to the present embodiment include diethyl ether, diisopropyl ether, dibutyl ether, methyl tert-butyl ether, ethyl tert-butyl ether, dipentyl ether, dihexyl ether, diheptyl ether, and dioctyl ether. Examples of the nitrile compounds include hydrogen cyanide, acetonitrile, propionitrile, acrylonitrile, butyronitrile, benzonitrile, benzyl nitrile, malononitrile, adiponitrile, and ethyl cyanoacetate. Examples of the aldehyde compounds include acetaldehyde, propionaldehyde, acrolein, butyraldehyde, crotonaldehyde, pentanal, hexanal, heptanal, octanal, nonanal, decanal, benzaldehyde, cinnamaldehyde, perillaldehyde, and glyoxal.

Specific examples of the carboxylic acid compounds used as the liquid compound that can be applied to the present embodiment include formic acid, acetic acid, propionic acid, acrylic acid, butanoic acid, methacrylic acid, pentanoic acid, hexanoic acid, heptanoic acid, octanoic acid, nonanoic acid, and decanoic acid. Examples of the ester compounds include ethyl formate, methyl formate, methyl acetate, ethyl acetate, vinyl acetate, allyl acetate, propyl acetate, butyl acetate, pentyl acetate, hexyl acetate, methyl propionate, ethyl propionate, propyl propionate, butyl propionate, pentyl propionate, butanoic acid methyl ester, butanoic acid ethyl ester, butanoic acid propyl ester, butanoic acid butyl ester, butanoic acid pentyl ester, butanoic acid hexyl ester, methyl acrylate, ethyl acrylate, propyl acrylate, butyl acrylate, methyl methacrylate, ethyl methacrylate, and butyl methacrylate.

Specific examples of the amine compounds used as the liquid compound that can be applied to the present embodiment include ethylamine, diethylamine, triethylamine, propylamine, isopropylamine, dipropylamine, diisopropylamine, tripropylamine, triisopropylamine, butylamine, dibutylamine, tributylamine, pentylamine, dipentylamine, tripentylamine, hexylamine, dihexylamine, trihexylamine, pentylamine, dipentylamine, tripentylamine, octylamine, dioctylamine, trioctylamine, nonylamine, 1-pentadecylamine, cyclohexylamine, dicyclohexylamine, benzylamine, and N,N-dimethylbenzylamine.

Specific examples of the nitrogen oxides used as the liquid compound that can be applied to the present embodiment include nitrogen dioxide. Examples also include water. Examples of the alcohol compounds include methyl alcohol, ethyl alcohol, 1-propanol, 2-propanol, n-butyl alcohol, isobutyl alcohol, 2-butanol, 2-methyl-2-propanol, 1-pentanol, 1-hexanol, 1-heptanol, 1-octanol, 1-nonanol, 1-decanol, 1-undecanol, 1-dodecanol, 1-tridecanol, 1-tetradecanol, 1-pentadecanol, benzyl alcohol, propylene glycol, 1,3-propanediol, 1,4-butanediol, 1,3-butanediol, 1,6-hexanediol, and glycerin. Examples of the ketone compounds include acetone, methyl ethyl ketone, 2-methylpentane, 3-methyl-1-pentene, 4-methyl-1-pentene, and 2-pentadecanone.

Specific examples of the compounds containing group 4-12 metals used as the liquid compound that can be applied to the present embodiment include $TiCl_4$, $Ti(OC_3H_7)_4$, $Ti[OCH(CH_3)_2]_4$, $Ti(OC_4H_9)_4$, $Ti[OCH_2CH(CH_3)_2]_4$, $Ti[OCH_2CH(CH_3)_2]_4$, $Ti[OCH(CH_3)(C_2H_5)]_4$, $Ti[OC(CH_3)_3]_4$, $Zr[N(CH_3)(C_2H_5)CH_3]_4$, $HfCl_4$, $Hf[N(CH_3)(C_2H_5)(CH_3)]_4$, $Hf[N(CH_3)_2]_4$, $Hf[N(C_2H_5)_2]_4$, $Ta(OC_2H_5)_5$, $MoF_6$, $WF_6$, $Fe(CO)_5$, $Zn(CH_3)_2$, and $Zn(C_2H_5)_2$.

Examples of the boron compounds include $B(C_2H_5)_3$, $B(OCH_3)_3$, $B(OC_2H_5)_3$, $BCl_3$, and $BBr_3$. Examples of the aluminum compounds include $Al(CH_3)_3$, $Al(N(C_2H_5)_2)_3$, $Al(C_2H_5)_3$, and $Al(C_3H_7)_3$. Examples of the gallium compounds include $Ga(CH_3)_3$ and $Ga(C_2H_5)_3$. Examples of the indium compounds include $In(C_2H_5)_3$. Examples of the silicon compounds include $HSi(OCH_3)_3$, $CH_3Si(OCH_3)_3$, $Si(OCH_3)_4$, $HSi(OC_2H_5)_3$, $CH_3Si(OC_2H_5)_3$, $Si(OC_2H_5)_4$, $SiH[N(CH_3)_2]'$, and $SiCl4$. Examples of the germanium compounds include $GeCl4$. Examples of the tin compounds include $SnCl_4$. Examples of the lead compounds include $PbCl_4$.

Specific examples of the phosphorus compounds used as the liquid compound that can be applied to the present embodiment include $PH(C_2H_5)_2$, $P(C_4H_9)_3$, $P[C(CH_3)_3]_3$, $P(OCH_3)_3$, $PO(OC_2H_5)_3$, $PCl_3$, $PBr_3$, and $POCl_3$. Examples of the arsenic compounds include $As(CH_3)_3$, $As(C_2H_5)_3$, $As[C(CH_3)_3]_3$, and $AsCl_3$. Examples of the antimony compounds include $SbF_5$ and $SbCl_5$. Examples of the sulfur compounds include ethanethiol, 1-propanethiol, allyl mercaptan, 1-butanethiol, 1-pentanethiol, 1-hexanethiol, 1-heptanethiol, 1-octanethiol, 2-aminobenzenethiol, 4-aminobenzenethiol, dimethyl sulfide, diethyl sulfide, dimethyl disulfide, thiophene, carbon disulfide, sulfolane, and dimethyl sulfoxide. Examples of the selenium compounds include benzeneselenol, dimethylselenium, diethylselenium, selenophene, and 2-formylselenophene.

The halogen-containing compounds, the compounds containing group 4-12 metals, the compounds containing group 13 elements, the compounds containing group 14 elements, the compounds containing group 15 elements, and the compounds containing group 16 elements are preferable.

The gas supply apparatus and the gas supply method according to the present embodiment will be specifically described below referring to the drawings.

Figure 1:
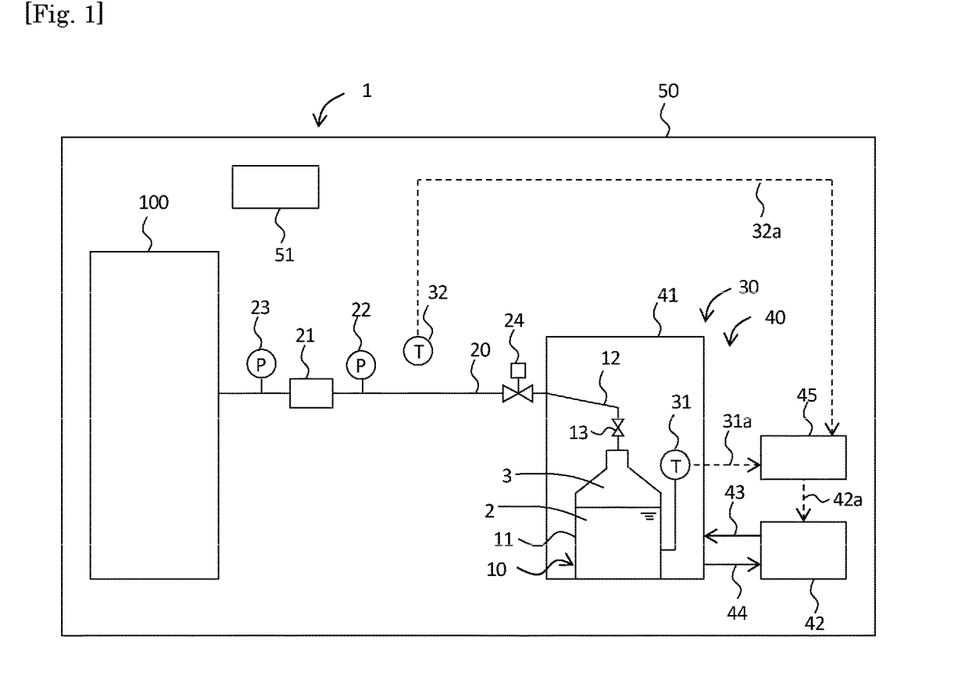
FIG. 1 is a schematic diagram illustrating a gas supply apparatus and a gas supply method according to a first embodiment.

First Embodiment (FIG. 1)

<Gas Supply Apparatus 1>

FIG. 1 is a schematic diagram illustrating a gas supply apparatus and a gas supply method according to a first embodiment.

A gas supply apparatus 1 according to the first embodiment is a gas supply apparatus for supplying a gas compound 3 obtained by vaporizing a liquid compound 2 to a target location (etching apparatus in the present embodiment) 100. The gas supply apparatus 1 comprises a storage vessel 10 capable of storing the liquid compound 2; a gas compound supply pipeline 20, one end of which is connected to the storage vessel 10, and the other end of which is capable of being disposed at the target location (etching apparatus) 100; and a temperature control device 30 configured to adjust the temperature of the liquid compound 2 within the storage vessel 10 to be equal to or lower than the surrounding temperature (such as below the surrounding temperature) of the gas compound supply pipeline 20.

The other end of the gas compound supply pipeline 20 is connected to the target location (etching apparatus) 100. The target location (etching apparatus) 100 is used in a vacuum. Hence, the difference between the pressure in the target location (etching apparatus) 100 and the pressure in the gas supply apparatus 1 enables the gas compound to be supplied from the gas supply apparatus 1 to the target location (etching apparatus) 100.

The temperature control device 30 comprises a liquid temperature measuring device 31 configured to measure the temperature of the liquid compound 2 within the storage vessel 10, and a heat transfer device 40 configured to receive a signal relating to the temperature measured by the liquid temperature measuring device 31 to give or receive heat to or from the storage vessel 10 so as to adjust the measured temperature to be equal to or lower than the surrounding temperature (such as below the surrounding temperature) of the gas compound supply pipeline 20.

The gas supply apparatus 1 further comprises a surrounding temperature measuring device 32 configured to measure the surrounding temperature of the gas compound supply pipeline 20 and send the measurement result to the heat transfer device 40.

The heat transfer device 40 comprises a heat insulating container 41 accommodating the storage vessel 10, a heating medium supply device 42 that supplies a heating medium to the heat insulating container 41, a heating medium supply pipeline 43 and a heating medium return pipeline 44 that connect the heat insulating container 41 to the heating medium supply device 42, and a control device 45 that controls the temperature of the heating medium in the heating medium supply device 42.

The heating medium may be a liquid such as water or a gas such as air.

The control device 45 receives a signal relating to the temperature of the liquid measured by the liquid temperature measuring device 31 and a signal relating to the surrounding temperature measured by the surrounding temperature measuring device 32 and can control the output from the heating medium supply device 42 so that the temperature of the liquid will be equal to or lower than the surrounding temperature (such as below the surrounding temperature). In the present embodiment, when the control device 45 receives the signal relating to the surrounding temperature, the control device 45 can set a set temperature range with an upper limit a predetermined magnitude lower than the surrounding temperature and a lower limit a predetermined magnitude lower than the upper limit.

The control device 45 can receive, through a wire 31a, the signal relating to the temperature of the liquid measured by the liquid temperature measuring device 31, can receive, through a wire 32a, the signal relating to the surrounding temperature measured by the surrounding temperature measuring device 32, and can send an output signal to the heating medium supply device 42 through a wire 42a.

Part or all of the wires 31a, 32a, and 42a may be replaced by wireless connections.

In addition, the gas supply apparatus 1 comprises a housing chamber 50. The housing chamber 50 accommodates the storage vessel 10, the gas compound supply pipeline 20, and the temperature control device 30. The housing chamber 50 also accommodates the target location (etching apparatus) 100.

The housing chamber 50 comprises an air conditioning device 51 that controls the temperature of the interior space of the housing chamber 50.

The storage vessel 10 comprises a storage vessel body 11 and a connecting pipeline 12 connecting the gas compound containing region of the storage vessel body 11 to the gas compound supply pipeline 20. The connecting pipeline 12 comprises an on-off valve 13.

The connecting pipeline 12 is inclined upward relative to the horizontal from the storage vessel body 11 side to the gas compound supply pipeline 20 side. In case that the gas compound is condensed within the connecting pipeline 12 to become the liquid compound, the above structure allows the liquid compound to run down along the inclination of the connecting pipeline 12 into the storage vessel body 11.

The inclination angle of the connecting pipeline 12 relative to the horizontal line is preferably 10 to 90°, more preferably 20 to 80°.

A mass flow controller (MFC) 21 is disposed midway of the gas compound supply pipeline 20, and pressure gauges 22 and 23 are disposed upstream and downstream from the mass flow controller 21. A pressure regulating valve 24 is disposed midway of the gas compound supply pipeline 20 and upstream from the pressure gauge 22.

<Gas Supply Method>

Subsequently, the gas supply method employing the gas supply apparatus 1 having the above constitution will be described.

In the housing chamber 50, the air conditioning device 51 adjusts the temperature in the housing chamber 50 to a predetermined temperature. In the housing chamber 50, the surrounding temperature measuring device 32 measures the surrounding temperature of the gas compound supply pipeline 20. In addition, the liquid temperature measuring device 31 measures the temperature of the liquid compound 2 within the storage vessel 10.

The liquid temperature measuring device 31 sends the signal relating to the temperature of the liquid to the control device 45 through the wire 31a. The surrounding temperature measuring device 32 sends the signal relating to the surrounding temperature to the control device 45 through the wire 32a. The control device 45 receives the signal relating to the temperature of the liquid from the liquid temperature measuring device 31 and the signal relating to the surrounding temperature from the surrounding temperature measuring device 32 and sends the output signal to the heating medium supply device 42 on the basis of the signals. The heating medium supply device 42 cools or heats the heating medium within the heating medium supply device 42 on the basis of the output signal. The temperature of the heating medium within the heating medium supply device 42 is thus controlled.

The heating medium supply device 42 supplies the heating medium, the temperature of which has been thus adjusted, to the heat insulating container 41 through the heating medium supply pipeline 43. The heating medium supplied to the heat insulating container 41 gives or receives heat to or from the liquid compound 2 or the gas compound 3 within the storage vessel 10 through the storage vessel 10. The temperature of the liquid compound 2 within the storage vessel 10 is thus adjusted to be within the set temperature range. The heating medium within the heat insulating container 41 is then sent back to the heating medium supply device 42 through the heating medium return pipeline 44.

As described above, in the present embodiment, the temperature of the gas compound 3 within the storage vessel 10 is adjusted to be within the set temperature range, which is equal to or lower than the surrounding temperature (such as below the surrounding temperature) of the gas compound supply pipeline 20, by adjusting the temperature of the liquid compound 2 within the storage vessel 10 to be within the set temperature range using the heat of the heating medium.

The gas compound 3 within the storage vessel 10 is supplied to the target location (etching apparatus) 100 through the connecting pipeline 12 and the gas compound supply pipeline 20 and is used in the target location (etching apparatus) 100.

The mass flow controller 21 controls the flow rate of the gas compound 3 within the gas compound supply pipeline 20.

As described above, the temperature of the gas compound 3 within the storage vessel 10 is adjusted to be equal to or lower than the surrounding temperature (such as below the surrounding temperature) of the gas compound supply pipeline 20. Hence, the gas compound 3 is prevented from being condensed within the gas compound supply pipeline 20 when the gas compound 3 within the storage vessel 10 is supplied to and cooled in the gas compound supply pipeline 20.

As described above, in the present embodiment, the measured temperature of the liquid compound 2 is adjusted to be within the set temperature range by measurement of the temperature of the liquid compound 2 stored in the storage vessel 10 and giving or receiving of heat to or from the liquid compound 2 on the basis of the measured temperature. The upper limit of the set temperature range is a specific value equal to or lower than the surrounding temperature (such as below the surrounding temperature) of the gas compound supply pipeline 20.

When the temperature of the liquid compound 2 within the storage vessel 10 has reached the upper limit of the set temperature range, the amount of heat to be supplied to the liquid compound 2 or the gas compound 3 within the storage vessel 10 via the heating medium is adjusted to be equal to or less than the amount of heat consumed by vaporization of the liquid compound 2. The temperature of the liquid compound 2 is thus lowered to a temperature equal to or lower than the upper limit.

The storage vessel 10 may be cooled when the temperature of the liquid compound 2 within the storage vessel 10 has reached the upper limit of the set temperature range. The temperature of the liquid compound 2 within the storage vessel 10 is thus promptly lowered to a temperature equal to or lower than the upper limit. In this case, it is possible to cause, in the heat transfer device 40, the temperature of the heating medium to be lower than the liquid compound 2 within the storage vessel 10 and supply the heating medium to the heat insulating container 41.

The upper limit of the set temperature range is preferably a specific value within the range of 5 to 40° C., the lower limit of the set temperature range is preferably a specific value within the range of 5 to 40° C., the boiling point of the liquid compound 2 at a gas pressure within the storage vessel 10 is preferably higher than the upper limit, and the melting point of the liquid compound 2 at the gas pressure within the storage vessel 10 is preferably lower than the lower limit. With this constitution, the liquid compound 2 that is in a liquid state at around room temperature, that is, at 5 to 40° C., can be supplied to the target location (etching apparatus) 100.

(Initial Operation Step)

The following initial operation step is preferably performed at the start of the operation using the gas supply apparatus 1 according to the present embodiment.

Specifically, the initial operation step includes adjusting the temperature (for example, cooling) of the storage vessel 10 to adjust the temperature of the liquid compound 2 within the storage vessel 10 to be equal to or lower than the surrounding temperature (such as below the surrounding temperature) of the gas compound supply pipeline 20 and then supplying the gas compound 3 within the storage vessel 10 to the target location (etching apparatus) 100 through the gas compound supply pipeline 20.

At the start of operation, the temperature within the storage vessel 10 is often about the same as the surrounding temperature of the gas compound supply pipeline 20. In such a case, blocking of the gas compound supply pipeline 20 is certainly prevented by cooling the storage vessel 10 to adjust the temperature of the liquid compound 2 or the gas compound 3 within the storage vessel 10 to be equal to or lower than the surrounding temperature (such as below the surrounding temperature) of the gas compound supply pipeline 20 at the start of operation and then supplying the gas compound 3 to the target location (etching apparatus) 100.

Also, air or an inert gas such as nitrogen, helium, and argon can be evacuated in advance from the pipeline extending from the storage vessel 10 to the target location 100 by reducing the pressure in the pipeline or drawing vacuum on the pipeline before the initial operation step as appropriate.
(Steady Operation Step)

The following steady operation step is preferably performed after the above initial operation step.

Specifically, the steady operation step includes supplying the gas compound 3 within the storage vessel 10 to the target location (etching apparatus) 100 through the gas compound supply pipeline 20 and supplying thermal energy to the storage vessel 10 to compensate thermal energy consumed by vaporization of the liquid compound 2.

The gas compound 3 and the liquid compound 2 within the storage vessel 10 are thus kept at constant temperatures. This constitution prevents drops in the amount of vaporization of the liquid compound 2 due to drops in the temperatures of the gas compound 3 and the liquid compound 2 within the storage vessel 10 and thus prevents drops in the amount of the gas compound 3 to be supplied to the target location (etching apparatus) 100.

Figure 2:
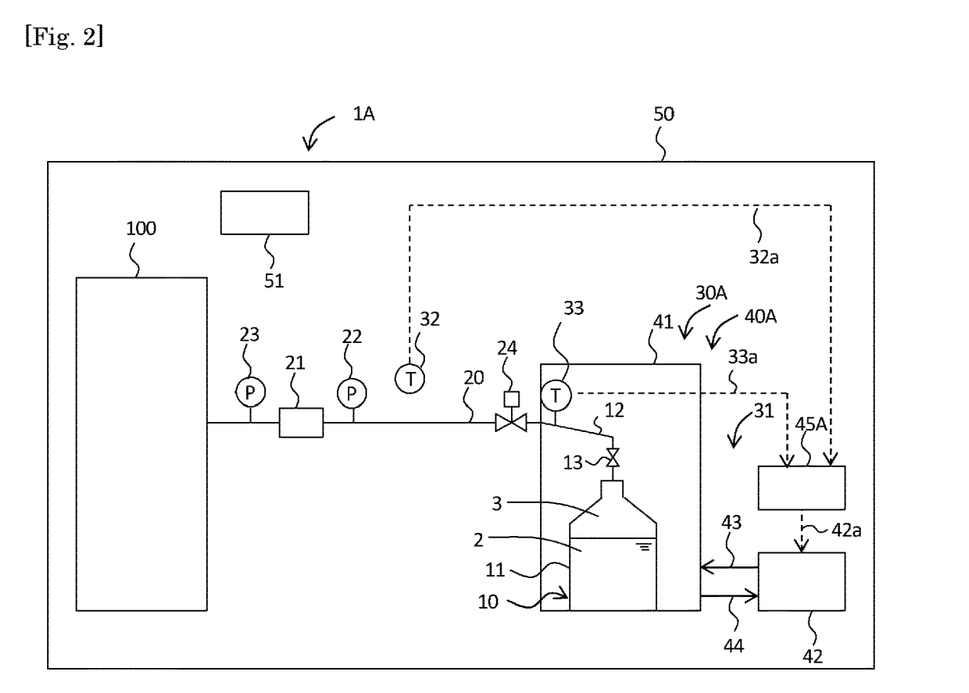
FIG. 2 is a schematic diagram illustrating a gas supply apparatus and a gas supply method according to a second embodiment.

Second Embodiment (FIG. 2)

<Gas Supply Apparatus 1A>

FIG. 2 is a schematic diagram illustrating a gas supply apparatus and a gas supply method according to a second embodiment.

A gas supply apparatus 1A according to the second embodiment comprises a gas temperature measuring device 33 on the connecting pipeline 12 instead of the liquid temperature measuring device 31 in the gas supply apparatus 1 shown in FIG. 1. The gas temperature measuring device 33 is connected to a control device 45A through a wire 33a.

That is, the gas supply apparatus 1A according to the second embodiment is the gas supply apparatus 1A for supplying the gas compound 3 obtained by vaporizing the liquid compound 2 to the target location (etching apparatus) 100, comprising the storage vessel 10 capable of storing the liquid compound 2; the gas compound supply pipeline 20, one end of which is connected to the storage vessel 10, and the other end of which is capable of being disposed at the target location (etching apparatus) 100; and a temperature control device 30A configured to adjust the temperature of the gas compound 3 within the storage vessel 10 to be equal to or lower than the surrounding temperature (such as below the surrounding temperature) of the gas compound supply pipeline 20.

The temperature control device 30A comprises the gas temperature measuring device 33 configured to measure the temperature of the gas compound 3 within the storage vessel 10, and a heat transfer device 40A configured to receive a signal relating to the temperature measured by the gas temperature measuring device 33 to give or receive heat to or from the storage vessel 10 so as to adjust the measured temperature to be equal to or lower than the surrounding temperature (such as below the surrounding temperature) of the gas compound supply pipeline 20.

The gas supply apparatus 1A further comprises the surrounding temperature measuring device 32 configured to measure the surrounding temperature of the gas compound supply pipeline 20 and send the measurement result to the heat transfer device 40A.

The heat transfer device 40A comprises the heat insulating container 41 accommodating the storage vessel 10, the heating medium supply device 42 that supplies the heating medium to the heat insulating container 41, the heating medium supply pipeline 43 and the heating medium return pipeline 44 that connect the heat insulating container 41 to the heating medium supply device 42, and a control device 45A that controls the temperature of the heating medium in the heating medium supply device 42.

The control device 45A receives signals relating to the temperature of the gas compound measured by the gas temperature measuring device 33 and the surrounding temperature measured by the surrounding temperature measuring device 32 and can control the output from the heating medium supply device 42 so that the temperature of the gas compound will be equal to or lower than the surrounding temperature (such as below the surrounding temperature).

The control device 45A can receive, through the wire 33a, the signal relating to the temperature of the gas measured by the gas temperature measuring device 33, can receive, through the wire 32a, the signal relating to the surrounding temperature measured by the surrounding temperature measuring device 32, and can send an output signal to the heating medium supply device 42 through the wire 42a.

Part or all of the wires 31a, 32a, and 42a may be replaced by wireless connections.

In addition, the gas supply apparatus 1 comprises the housing chamber 50. The structure of the housing chamber 50 is substantially the same as in the first embodiment.

The structure of the storage vessel 10 is substantially the same as in the first embodiment. That is, the storage vessel 10 comprises the storage vessel body 11 and the connecting pipeline 12 connecting the gas compound containing region of the storage vessel body 11 to the gas compound supply pipeline 20. The connecting pipeline 12 comprises the on-off valve 13.

The gas temperature measuring device 33 is disposed on the connecting pipeline 12. The position of the gas temperature measuring device 33 is preferably as close to the gas compound supply pipeline 20 as possible. Since this structure enables measurement of the temperature of the gas compound 3 just before being supplied to the gas compound supply pipeline 20, blocking of the gas compound supply pipeline 20 due to the liquid compound 2 is more certainly prevented.

In view of the above, the position is preferably located on the gas compound supply pipeline 20 side of the intermediate position along the length of the connecting pipeline 12. Also, the position is preferably located at a distance of 100 cm or less, more preferably 50 cm or less, from the joint between the connecting pipeline 12 and the gas compound supply pipeline 20.

The structure of the gas compound supply pipeline 20 is substantially the same as in the first embodiment.

<Gas Supply Method>

A gas supply method employing the gas supply apparatus 1A having the above constitution is substantially the same as in the case of the first embodiment except that the gas temperature measuring device 33 is used instead of the liquid temperature measuring device 31.

That is, the gas temperature measuring device 33 sends the signal relating to the temperature of the gas to the control device 45A through the wire 33a. The surrounding temperature measuring device 32 sends the signal relating to the surrounding temperature to the control device 45A through the wire 32*a*. The control device 45A receives the signal relating to the temperature of the gas compound from the gas temperature measuring device 33 and the signal relating to the surrounding temperature from the surrounding temperature measuring device 32 and sends the output signal to the heating medium supply device 42 on the basis of the signals. The heating medium supply device 42 cools or heats the heating medium within the heating medium supply device 42 on the basis of the output signal. The temperature of the heating medium within the heating medium supply device 42 is thus controlled.

The heating medium supply device 42 supplies the heating medium, the temperature of which has been thus adjusted, to the heat insulating container 41 through the heating medium supply pipeline 43. The heating medium supplied to the heat insulating container 41 gives or receives heat to or from the liquid compound 2 or the gas compound 3 within the storage vessel 10 through the storage vessel 10. The temperature of the liquid compound 2 within the storage vessel 10 is thus adjusted to be within the set temperature range. The heating medium within the heat insulating container 41 is then sent back to the heating medium supply device 42 through the heating medium return pipeline 44.

As described above, in the present embodiment, the temperature of the gas compound 3 within the storage vessel 10 is adjusted to be within the set temperature range, which is equal to or lower than the surrounding temperature (such as below the surrounding temperature) of the gas compound supply pipeline 20.

The gas supply method according to the present embodiment is substantially the same as the gas supply method according to the first embodiment except for the above points.

The upper limit of the set temperature range is preferably a specific value within the range of 5 to 40° C., the lower limit of the set temperature range is preferably a specific value within the range of 5 to 40° C., the boiling point of the liquid compound 2 at a gas pressure within the storage vessel 10 is preferably higher than the upper limit, and the melting point of the liquid compound 2 at the gas pressure within the storage vessel 10 is preferably lower than the lower limit.

With this constitution, the liquid compound 2 that is in a liquid state at around room temperature, that is, at 5 to 40° C., can be supplied to the target location (etching apparatus) 100.

The initial operation step and the steady operation step are substantially the same as in the case of the first embodiment.

Figure 3:
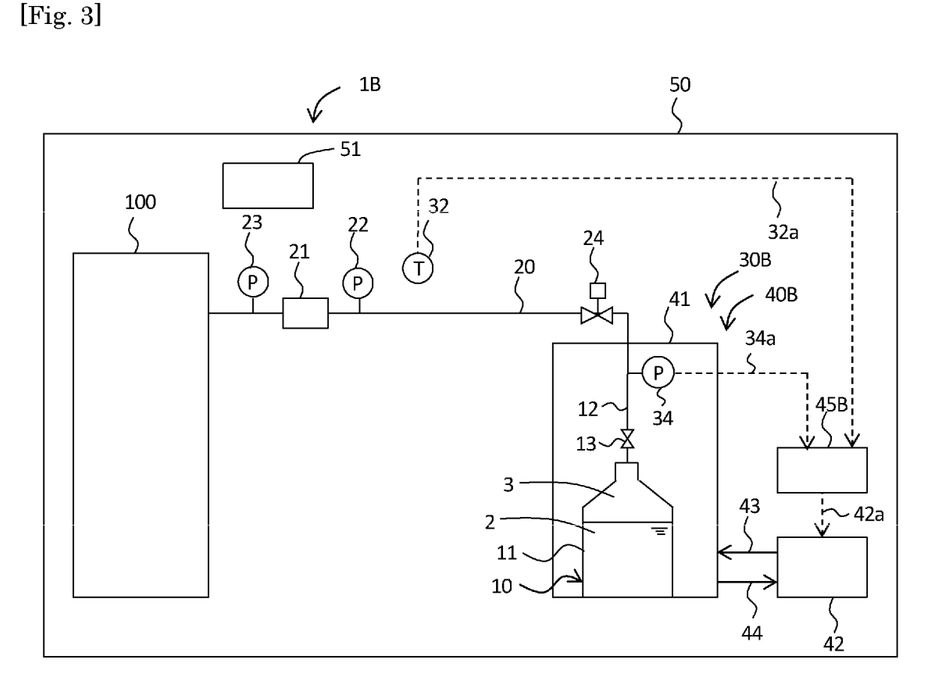
FIG. 3 is a schematic diagram illustrating a gas supply apparatus and a gas supply method according to a third embodiment.

Third Embodiment (FIG. 3)

<Gas Supply Apparatus 1B>

FIG. 3 is a schematic diagram illustrating a gas supply apparatus and a gas supply method according to a third embodiment.

A gas supply apparatus 1B according to the third embodiment differs from the gas supply apparatus 1A in FIG. 2 in that a pressure measuring device 34 is disposed on the connecting pipeline 12 instead of the gas temperature measuring device 33 and is connected to a control device 45B through a wire 34*a*.

That is, the gas supply apparatus 1B according to the third embodiment is the gas supply apparatus 1B for supplying the gas compound 3 obtained by vaporizing the liquid compound 2 to the target location (etching apparatus) 100, comprising the storage vessel 10 capable of storing the liquid compound 2; the gas compound supply pipeline 20, one end of which is connected to the storage vessel 10, and the other end of which is capable of being disposed at the target location (etching apparatus) 100; and a temperature control device 30B configured to adjust the temperature of the gas compound 3 or the liquid compound 2 within the storage vessel 10 to be equal to or lower than the surrounding temperature (such as below the surrounding temperature) of the gas compound supply pipeline 20.

As described later, in the present embodiment, the temperature of the gas compound 3 or the liquid compound 2 within the storage vessel 10 is adjusted to be equal to or lower than the surrounding temperature (such as below the surrounding temperature) of the gas compound supply pipeline 20 by adjusting the pressure of the gas compound 3 within the storage vessel 10.

The temperature control device 30B comprises the pressure measuring device 34 configured to measure the pressure of the gas compound 3 within the storage vessel 10, and a heat transfer device 40B configured to receive a signal relating to the pressure measured by the pressure measuring device 34 to give or receive heat to or from the storage vessel 10 so as to adjust the measured pressure to be equal to or lower than the saturated vapor pressure (such as below the saturated vapor pressure) of the gas compound at a temperature equal to the surrounding temperature of the gas compound supply pipeline 20.

The gas supply apparatus 1B further comprises the surrounding temperature measuring device 32 configured to measure the surrounding temperature of the gas compound supply pipeline 20 and send the measurement result to the heat transfer device 40B.

The heat transfer device 40B comprises the heat insulating container 41 accommodating the storage vessel 10, the heating medium supply device 42 that supplies the heating medium to the heat insulating container 41, the heating medium supply pipeline 43 and the heating medium return pipeline 44 that connect the heat insulating container 41 to the heating medium supply device 42, and a control device 45B that controls the temperature of the heating medium in the heating medium supply device 42.

The control device 45B receives the signals relating to the pressure of the gas measured by the pressure measuring device 34 and the surrounding temperature measured by the surrounding temperature measuring device 32 and can control the output from the heating medium supply device 42 so that the measured pressure will be equal to or lower than the saturated vapor pressure (such as below the saturated vapor pressure) of the gas compound at a temperature equal to the surrounding temperature.

The control device 45B preferably comprises a memory unit that stores, from the outset, computational expressions, tables, or the like indicating the relation between the temperature and the saturated vapor pressure of the liquid compound 2 to be used.

The control device 45B can receive, through the wire 34*a*, the signal relating to the pressure of the gas measured by the pressure measuring device 34, can receive, through the wire 32*a*, the signal relating to the surrounding temperature measured by the surrounding temperature measuring device 32, and can send an output signal to the heating medium supply device 42 through the wire 42*a*. Part or all of the wires 34*a*, 32*a*, and 42*a* may be replaced by wireless connections.

In addition, the gas supply apparatus 1B comprises the housing chamber 50. The structure of the housing chamber 50 is substantially the same as in the first embodiment.

The structure of the storage vessel 10 is substantially the same as in the first embodiment. That is, the storage vessel 10 comprises the storage vessel body 11 and the connecting pipeline 12 connecting the gas compound containing region of the storage vessel body 11 to the gas compound supply pipeline 20. The connecting pipeline 12 comprises the on-off valve 13. Although the connecting pipeline 12 perpendicularly extends in FIG. 3, the connecting pipeline 12 may be inclined upward from the storage vessel body 11 side to the gas compound supply pipeline 20 side as shown in FIG. 1 and FIG. 2.

The pressure measuring device 34 is disposed on the connecting pipeline 12. The position of the pressure measuring device 34 is preferably as close to the gas compound supply pipeline 20 as possible. Since this structure enables measurement of the pressure of the gas compound 3 just before being supplied to the gas compound supply pipeline 20, blocking of the gas compound supply pipeline 20 due to the liquid compound 2 is more certainly prevented. In view of the above, the position is preferably located on the gas compound supply pipeline 20 side of the intermediate position along the length of the connecting pipeline 12. Also, the position is preferably located at a distance of 100 cm or less, more preferably 50 cm or less, from the joint between the connecting pipeline 12 and the gas compound supply pipeline 20.

The structure of the gas compound supply pipeline 20 is substantially the same as in the first embodiment.

<Gas Supply Method>

Subsequently, the gas supply method employing the gas supply apparatus 1B having the above constitution will be described.

The pressure measuring device 34 sends the signal relating to the pressure of the gas compound 3 within the storage vessel 10 to the control device 45B through the wire 34a. The surrounding temperature measuring device 32 sends the signal relating to the surrounding temperature to the control device 45B through the wire 32a.

The control device 45B determines, on the basis of the signal relating to the surrounding temperature, the pressure (saturated vapor pressure) in the case where the temperature of the gas compound 3 is set to be equal to the surrounding temperature. The control device 45B then sends an output signal to the heating medium supply device 42 so that the pressure of the gas compound 3 received as a signal from the pressure measuring device 34 will be lower than the pressure (saturated vapor pressure). For example, the output signal is determined so that the pressure of the gas compound 3 received as a signal from the pressure measuring device 34 will be within a set pressure range lower than the pressure (saturated vapor pressure) at a temperature set to be equal to the surrounding temperature, and the output signal is sent to the heating medium supply device 42.

The heat transfer device 40B cools or heats the heating medium within the heating medium supply device 42 on the basis of the output signal. The temperature of the heating medium within the heating medium supply device 42 is thus controlled.

The heating medium supply device 42 supplies the heating medium, the temperature of which has been thus adjusted, to the heat insulating container 41 through the heating medium supply pipeline 43. The heating medium supplied to the heat insulating container 41 gives or receives heat to or from the liquid compound 2 or the gas compound 3 within the storage vessel 10 through the storage vessel 10.

The pressure of the gas compound 3 within the storage vessel 10 is adjusted to be equal to or lower than the pressure (saturated vapor pressure) (such as below the saturated vapor pressure) at a temperature set to be equal to the surrounding temperature of the gas compound supply pipeline 20 in this way.

The heating medium within the heat insulating container 41 is then sent back to the heating medium supply device 42 through the heating medium return pipeline 44.

As described above, in the present embodiment, the temperature of the gas compound 3 within the storage vessel 10 is adjusted to be within the set temperature range, which is equal to or lower than the surrounding temperature (such as below the surrounding temperature) of the gas compound supply pipeline 20, by adjusting the pressure of the gas compound 3 within the storage vessel 10 to be within the set pressure range.

The gas compound 3 within the storage vessel 10 is supplied to the target location (etching apparatus) 100 through the connecting pipeline 12 and the gas compound supply pipeline 20 and is used in the target location (etching apparatus) 100.

The mass flow controller 21 controls the flow rate of the gas compound 3 within the gas compound supply pipeline 20.

As described above, the temperature of the gas compound 3 within the storage vessel 10 is adjusted to be equal to or lower than the surrounding temperature (such as below the surrounding temperature) of the gas compound supply pipeline 20. Hence, the gas compound 3 supplied to the gas compound supply pipeline 20 is prevented from being condensed within the pipeline due to cooling.

As described above, in the present embodiment, the measured pressure of the gas compound 3 is adjusted to be within the set pressure range by measuring the pressure of the gas compound 3 stored in the storage vessel 10 and giving or receiving heat to or from the liquid compound 2 within the storage vessel 10 on the basis of the measured pressure. The upper limit of the set pressure range is a specific value equal to or lower than the saturated vapor pressure (such as below the saturated vapor pressure) at the surrounding temperature of the gas compound supply pipeline 20.

When the pressure of the liquid compound 2 within the storage vessel 10 has reached the upper limit of the set pressure range, the amount of heat to be supplied to the liquid compound 2 or the gas compound 3 within the storage vessel 10 via the heating medium is adjusted to be equal to or less than the amount of heat consumed by vaporization of the liquid compound 2. The temperature of the liquid compound 2 is thus lowered to a temperature equal to or lower than the upper limit.

The storage vessel 10 may be cooled when the temperature of the liquid compound 2 within the storage vessel 10 has reached the upper limit of the set temperature range. The temperature of the liquid compound 2 within the storage vessel 10 is thus promptly lowered to a temperature equal to or lower than the upper limit. In this case, it is possible to cause, in the heating medium supply device 42, the heating medium to be at a low temperature and supply the heating medium to the heat insulating container 41.

In the above case, the pressure of the gas compound 3 received as a signal from the pressure measuring device 34 is adjusted to be within the set pressure range, which is a range of values equal to or lower than the pressure (saturated vapor pressure) at a temperature set to be equal to the surrounding temperature.

However, this case does not limit the pressure adjustment in the embodiment. For example, the pressure difference obtained by subtracting the pressure of the gas compound 3 received as a signal from the pressure measuring device 34 from the pressure (saturated vapor pressure) of the gas compound 3 at a temperature set to be equal to the surrounding temperature may be adjusted to be within a set pressure difference range.

In this case, the set pressure difference range is preferably 0.01 to 100 kPa, more preferably 0.1 to 90 kPa, further preferably 1.0 to 80 kPa.

The initial operation step and the steady operation step are substantially the same as in the case of the first embodiment.

Figure 4:
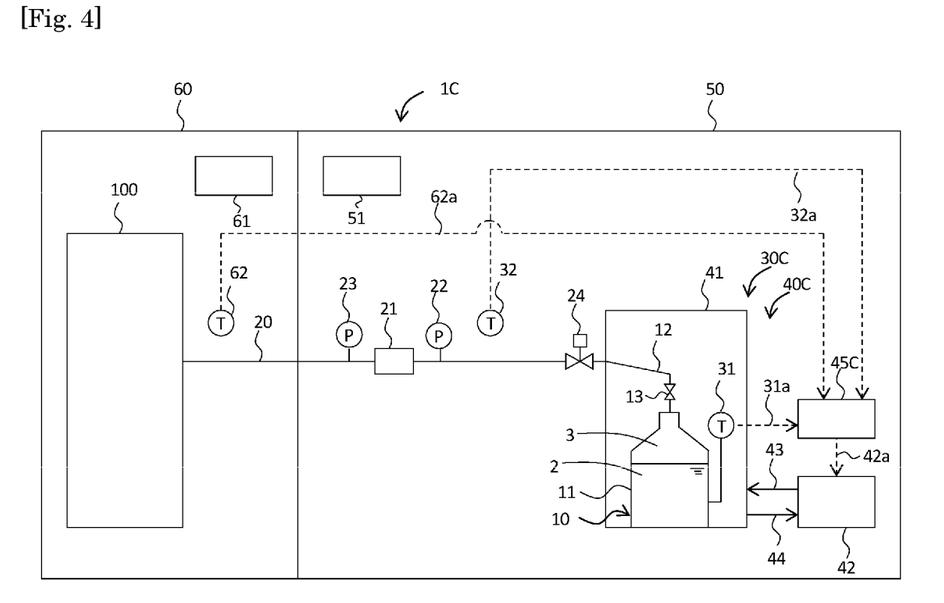
FIG. 4 is a schematic diagram illustrating a gas supply apparatus and a gas supply method according to a fourth embodiment.

Fourth Embodiment (FIG. 4)

<Gas Supply Apparatus 1C>

FIG. 4 is a schematic diagram illustrating a gas supply apparatus and a gas supply method according to a fourth embodiment.

A gas supply apparatus 1C according to the fourth embodiment is adjacent to an adjacent room (clean room) 60 provided with an air conditioning device 61. The adjacent room 60 is adjacent to the housing chamber 50. The target location 100 is disposed in the adjacent room 60.

One end of the gas compound supply pipeline 20 of the gas supply apparatus 1C is connected to the storage vessel 10, and the other end is connected to the target location 100. Hence, the gas compound supply pipeline 20 extends from the housing chamber 50 to the adjacent room 60.

A surrounding temperature measuring device 62 is disposed near the gas compound supply pipeline 20 in the adjacent room 60. The surrounding temperature measuring device 62 is connected to a control device 45C of a heat transfer device 40C through a wire 62a.

The control device 45C receives a signal relating to the temperature of the liquid measured by the liquid temperature measuring device 31, a signal relating to a surrounding temperature X measured by the surrounding temperature measuring device 32, and a signal relating to a surrounding temperature Y measured by the surrounding temperature measuring device 62 and can control the output from the heating medium supply device 42 so that the temperature of the liquid will be equal to or lower than the surrounding temperature X and equal to or lower than the surrounding temperature Y.

The constitution of the gas supply apparatus 1C according to the present embodiment is substantially the same as the constitution of the gas supply apparatus 1 except for the above points. The same reference numeral represents the same portion.

<Gas Supply Method>

In the present embodiment, the control device 45C receives the signal relating to the temperature of the liquid from the liquid temperature measuring device 31, the signal relating to the surrounding temperature X from the surrounding temperature measuring device 32, and the signal relating to the surrounding temperature Y from the surrounding temperature measuring device 62 and sends the output signal to the heating medium supply device 42 on the basis of the signals.

The heating medium supply device 42 cools or heats the heating medium within the heating medium supply device 42 on the basis of the output signal. The temperature of the heating medium within the heating medium supply device 42 is thus controlled.

The heating medium supply device 42 supplies the heating medium, the temperature of which has been thus adjusted, to the heat insulating container 41 through the heating medium supply pipeline 43. The heating medium supplied to the heat insulating container 41 gives or receives heat to or from the liquid compound 2 or the gas compound 3 within the storage vessel 10 through the storage vessel 10. The temperature of the liquid compound 2 within the storage vessel 10 is thus adjusted to be within the set temperature range. The heating medium within the heat insulating container 41 is then sent back to the heating medium supply device 42 through the heating medium return pipeline 44.

As described above, in the present embodiment, the temperature of the gas compound 3 within the storage vessel 10 is adjusted to be within the set temperature range, which is equal to or lower than the surrounding temperature X of the gas compound supply pipeline 20 and equal to or lower than the surrounding temperature Y of the gas compound supply pipeline 20, by adjusting the temperature of the liquid compound 2 within the storage vessel 10 to be within the set temperature range.

In the case where the temperature within the housing chamber 50 is set to be equal to the temperature within the adjacent room 60, either of the surrounding temperature measuring devices 32 and 62 may be eliminated. Alternatively, in the case where the temperature within the adjacent room 60 is consistently lower than the temperature within the housing chamber 50, the surrounding temperature measuring device 32 may be eliminated. Alternatively, in the case where the temperature within the adjacent room 60 is consistently higher than the temperature within the housing chamber 50, the surrounding temperature measuring device 62 may be eliminated.

Other Embodiments

The present invention is not limited to the above embodiments.

For example, the housing chamber 50 and/or the air conditioning device 51 in the first to fourth embodiments may be eliminated. Note that the gas compound is more certainly prevented from being condensed within the gas compound supply pipeline 20 in the case where the housing chamber 50 and the air conditioning device 51 are comprised.

In the case where the surrounding temperature of the gas compound supply pipeline is constant because, for example, the air conditioning device 51 is disposed in the housing chamber 50 in the first to fourth embodiments, the surrounding temperature measuring device 32 may be eliminated. In the case where the surrounding temperature of the gas compound supply pipeline is constant because, for example, the air conditioning device 61 is disposed in the adjacent room 60, the surrounding temperature measuring device 62 may be eliminated.

In the first to fourth embodiments, the temperature of the gas compound or the liquid compound within the storage vessel 10 may be adjusted to be equal to or lower than the surrounding temperature (such as below the surrounding temperature) of the gas compound supply pipeline on the basis of any two or all of the liquid temperature measuring device 31, the gas temperature measuring device 33, and the pressure measuring device 34 disposed. In this case, the surrounding temperature measuring device 32 may be disposed or eliminated. The surrounding temperature measuring device 62 may be disposed or eliminated.

The mass flow controller 21 may be eliminated, at least one of the pressure gauges 22 and 23 on its both sides may be eliminated, and the pressure regulating valve 24 may also be eliminated.

In the first to fourth embodiments, the heat transfer device 40, 40A, 40B, or 40C may be disposed outside the housing chamber 50. The heating medium may be a liquid or a gas.

The storage vessel 10 may be accommodated not in the heat insulating container 41 but in a metal container. In this case, it is possible that the metal container accommodates the storage vessel 10 and that the metal container is heated or cooled from outside.

A heater may be disposed instead of the heat transfer device 40, 40A, 40B, or 40C. Alternatively, a coolant pipeline for cooling may be wound around the outside of the heat insulating container 41.

In the above embodiments, the material for the gas compound supply pipeline 20 is not particularly limited as long as the material can endure reduced pressures. Examples of the material include stainless steel, carbon steel, and other various alloys. It is preferable that the gas compound supply pipeline 20 be not provided with means for heating the pipeline, such as a heater, in view of the cost of equipment and the operating costs. The gas compound supply pipeline 20 may be provided with a lagging material but is preferably provided with no lagging material in view of the cost of equipment and the operating costs. That is, it is preferable that nothing be disposed on the outside of the pipeline. Even in the case where the heating means or the lagging material is not disposed, the present embodiments can prevent the gas compound 3 from being condensed within the gas compound supply pipeline 20 as described above.

The target location 100 has been the etching apparatus in the above embodiments but may be semiconductor manufacturing equipment such as a CVD apparatus. There is no particular limitation as long as the target location 100 is an apparatus that uses a gas under a reduced pressure.

EXAMPLES

The following more specifically describes the present invention referring to examples and comparative examples, but the present invention is not limited to these examples at all.

The following gas supply apparatus was used.

<Gas Supply Apparatus>

The gas supply apparatus 1 shown in FIG. 1 was used. The tip of the gas compound supply pipeline 20 of the gas supply apparatus 1 was not connected to the target location (etching apparatus) 100 but connected to a vacuum pump provided with a trap for collecting the gas compound. The trap comprises a container that receives the gas compound and a coolant bath that accommodates the container. The coolant bath cools the container from the periphery, so that the gas compound within the container is liquefied and collected in the container.

Details of the gas compound supply apparatus 1 are as follows.

(1) Gas compound supply pipeline 20

Diameter: ⅛ in., length: 10 m, material: SUS304

(2) Housing chamber 50

Temperature: 20° C.

(3) Liquid compound

Hexafluorobenzene (saturated vapor pressure: 10.7 kPa (20° C.), melting point: 5° C., boiling point: 81° C.)

(4) Storage vessel 10

Capacity: 1 L, liquid compound fill volume: 0.7 L

Examples 1 to 13 and Comparative Examples 1 and 2

The liquid compound was supplied using the above gas supply apparatus under the conditions shown in Table 1. Table 1 shows the results.

Examples 14 to 16

The liquid compound was supplied using the above gas supply apparatus under the conditions shown in Table 2. Table 2 shows the results. In Examples 14 to 16, the MFC was fully opened (set point: 50 sccm).

TABLE 1

| | | Example | | | | | | | |
|---|---|---|---|---|---|---|---|---|---|
| | | 1 | 2 | 3 | 4 | 5 | 6 | 7 | 8 |
| Surrounding temperature of gas compound supply pipeline 20 (° C.) | | 10 | 15 | 15 | 20 | 20 | 20 | 20 | 20 |
| Temperature of liquid compound within storage vessel 10 (° C.) | | 10 | 10 | 15 | 10 | 10 | 15 | 15 | 15 |
| MFC21 | Set flow rate (sccm) | 10.0 | 10.0 | 10.0 | 2.5 | 10.0 | 2.5 | 10.0 | 10.0 |
| | Measured flow rate (sccm) | 11.0 | 10.7 | 10.7 | 2.8 | 10.7 | 2.8 | 10.7 | 10.8 |
| | Error (%) *1 | 10.0 | 6.6 | 6.8 | 12.4 | 7.2 | 10.6 | 6.8 | 7.8 |
| Amount of gas compound to be supplied | Decrease in content in storage vessel 10 (g) | 16.44 | 15.93 | 15.97 | 6.30 | 21.36 | 5.51 | 15.97 | 53.71 |
| | Increase in content in trap (g) | 16.03 | 15.82 | 15.90 | 6.28 | 21.35 | 5.50 | 16.03 | 53.51 |

TABLE 1-continued

| | | | | | | | | | |
|---|---|---|---|---|---|---|---|---|---|
| Supply time (min) | | 180 | 180 | 180 | 270 | 240 | 240 | 180 | 600 |
| Material balance (%)*2 | | 97.5 | 99.3 | 99.6 | 99.7 | 100.0 | 99.8 | 100.4 | 99.6 |
| Pressure | Upstream 22 from MFC 21 (MPaG) | −0.098 | −0.097 | −0.095 | −0.099 | −0.099 | −0.099 | −0.099 | −0.096 |
| | Downstream 23 from MFC 21 (MPaG) | −0.100 | −0.099 | −0.099 | −0.100 | −0.100 | −0.100 | −0.100 | −0.100 |
| | Vacuum pump (kPa) | 1.25 | 1.25 | 1.29 | 1.27 | 1.25 | 1.28 | 1.28 | 1.27 |
| Clogging of gas compound supply pipeline 20 | | No | No | No | No | No | No | No | No |

| | | Example | | | | | Comparative Example | |
|---|---|---|---|---|---|---|---|---|
| | | 9 | 10 | 11 | 12 | 13 | 1 | 2 |
| Surrounding temperature of gas compound supply pipeline 20 (° C.) | | 20 | 20 | 20 | 20 | 20 | 15 | 20 |
| Temperature of liquid compound within storage vessel 10 (° C.) | | 15 | 20 | 20 | 20 | 20 | 20 | 25 |
| MFC21 | Set flow rate (sccm) | 20.0 | 2.5 | 5.0 | 10.0 | 20.0 | 10 | 2.5 |
| | Measured flow rate (sccm) | 21.4 | 2.7 | 5.5 | 10.7 | 21.4 | 14.18 | 48.27 |
| | Error (%) *1 | 7.2 | 9.4 | 9.4 | 7.4 | 7.0 | 41.80 | 1831 |
| Amount of gas compound to be supplied | Decrease in content in storage vessel 10 (g) | 32.58 | 5.45 | 8.18 | 10.70 | 31.99 | 28.26 | 96.23 |
| | Increase in content in trap (g) | 32.56 | 5.21 | 7.91 | 10.25 | 31.99 | 23.20 | 30.46 |
| Supply time (min) | | 183 | 240 | 180 | 120 | 180 | 240 | 240 |
| Material balance (%)*2 | | 99.9 | 95.6 | 96.7 | 95.8 | 100.0 | 82.1 | 31.7 |
| Pressure | Upstream 22 from MFC 21 (MPaG) | −0.099 | −0.096 | −0.096 | −0.097 | −0.098 | −0.095 | −0.096 |
| | Downstream 23 from MFC 21 (MPaG) | −0.100 | −0.100 | −0.100 | −0.100 | −0.100 | −0.100 | −0.100 |
| | Vacuum pump (kPa) | 1.28 | 1.28 | 1.27 | 1.31 | 1.28 | 1.27 | 1.29 |
| Clogging of gas compound supply pipeline 20 | | No | No | No | No | No | Yes | Yes |

*1 The error (%) is a value obtained from the following equation:
The error (%) = (the measured flow rate − the set flow rate)/(the set flow rate) × 100
*2 The material balance is a value obtained from the following equation:
The material balance (%) = (the increase in the content in the trap)/(the decrease in the content in the storage vessel 10) × 100

TABLE 2

| | | Example | | |
|---|---|---|---|---|
| | | 14 | 15 | 16 |
| Surrounding temperature of gas compound supply pipeline 20 (° C.) | | 20 | 20 | 20 |
| Temperature of liquid compound within storage vessel 10 (° C.) | | 10 | 15 | 20 |
| MFC | Set flow rate (sccm) | 50.0 | 50.0 | 50.0 |
| | Measured flow rate (sccm) | 20.6 | 26.7 | 40.1 |
| | Error (%) | −58.7 | −46.6 | −19.7 |
| Amount of gas compound to be supplied | Decrease in content in storage vessel 10 (g) | 10.29 | 26.59 | 41.67 |
| | Increase in content in trap (g) | 10.28 | 26.52 | 41.61 |

TABLE 2-continued

|  |  | Example | | |
|---|---|---|---|---|
|  |  | 14 | 15 | 16 |
| Supply time (min) |  | 60 | 120 | 125 |
| Material balance (%) |  | 99.9 | 99.7 | 99.9 |
| Pressure | Upstream 22 from MFC 21 (MPaG) | −0.099 | −0.099 | −0.097 |
|  | Downstream 23 from MFC 21 (MPaG) | −0.100 | −0.100 | −0.100 |
|  | Vacuum pump (kPa) | 1.27 | 1.27 | 1.28 |
| Clogging of gas compound supply pipeline 20 |  | No | No | No |

*1: The error (%) is a value obtained from the following equation: The error (%) = (the measured flow rate − the set flow rate)/(the set flow rate) × 100
*2: The material balance is a value obtained from the following equation: Material balance (%) = (the increase in the content in the trap)/(the decrease in the content in the storage vessel 10) × 100

As shown in Table 1 and Table 2, in Examples 1 to 16, the compound was supplied to the trap without clogging of the gas compound supply pipeline 20 because the temperature of the liquid compound within the storage vessel 10 was equal to or lower than the surrounding temperature of the gas compound supply pipeline 20.

On the other hand, in Comparative Examples 1 and 2, the gas compound supply pipeline 20 was clogged with the gas compound condensed within the gas compound supply pipeline 20 because the temperature of the liquid compound within the storage vessel 10 was above the surrounding temperature of the gas compound supply pipeline 20.

REFERENCE SIGNS LIST

1, 1A, 1B, 1C Gas supply apparatuses
10 Storage vessel
11 Storage vessel body
12 Connecting pipeline
20 Gas compound supply pipeline
21 Mass flow controller (MFC)
30, 30A, 30B, 30C Temperature control devices
31 Liquid temperature measuring device
32 Surrounding temperature measuring device
33 Liquid temperature measuring device
34 Pressure measuring device
40, 40A, 40B, 40C Heat transfer devices
41 Heat insulating container
42 Heating medium supply device
45, 45A, 45B, 45C Control devices
50 Housing chamber
100 Target location

The invention claimed is:

1. A gas supply apparatus for supplying a gas compound obtained by vaporizing a liquid compound to a target location, the gas supply apparatus comprising:
 a storage vessel capable of storing the liquid compound;
 a gas compound supply pipeline, one end of which is connected to the storage vessel, and another end of which is capable of being disposed at the target location; and
 a temperature control device configured to adjust a temperature of the gas compound or the liquid compound within the storage vessel to be equal to or lower than a surrounding temperature of the gas compound supply pipeline,
 wherein the temperature control device is a device for cooling the storage vessel,
 wherein the storage vessel comprises:
 a storage vessel body; and
 a connecting pipeline connecting a gas compound containing region of the storage vessel body to the gas compound supply pipeline, wherein the connecting pipeline is inclined upward relative to the horizontal from a storage vessel body side to a gas compound supply pipeline side.

2. The gas supply apparatus according to claim 1, wherein the temperature control device comprises:
 a liquid temperature measuring device configured to measure the temperature of the liquid compound within the storage vessel; and
 a heat transfer device configured to receive a signal relating to the temperature measured by the liquid temperature measuring device to give or receive heat to or from the storage vessel so as to adjust the measured temperature to be equal to or lower than the surrounding temperature of the gas compound supply pipeline.

3. The gas supply apparatus according to claim 1, wherein the temperature control device comprises:
 a gas temperature measuring device configured to measure the temperature of the gas compound within the storage vessel; and
 a heat transfer device configured to receive a signal relating to the temperature measured by the gas temperature measuring device to give or receive heat to or from the storage vessel so as to adjust the measured temperature to be equal to or lower than the surrounding temperature of the gas compound supply pipeline.

4. The gas supply apparatus according to claim 1, wherein the temperature control device comprises:
 a pressure measuring device configured to measure a pressure of the gas compound within the storage vessel; and
 a heat transfer device configured to receive a signal relating to the pressure measured by the pressure measuring device to give or receive heat to or from the storage vessel so as to adjust the measured pressure to be equal to or lower than a saturated vapor pressure of the gas compound at a temperature equal to the surrounding temperature of the gas compound supply pipeline.

5. The gas supply apparatus according to claim 1, the gas supply apparatus further comprising a surrounding temperature measuring device configured to measure the surrounding temperature of the gas compound supply pipeline and send a signal relating to the surrounding temperature to the heat transfer device.

6. The gas supply apparatus according to claim 1, wherein a mass flow controller is disposed midway of the gas compound supply pipeline.

7. The gas supply apparatus according to claim 1, wherein a pressure of the gas compound within the storage vessel is higher than a pressure in the target location.

8. A gas supply apparatus for supplying a gas compound obtained by vaporizing a liquid compound to a target location, the gas supply apparatus comprising:
 a storage vessel capable of storing the liquid compound;
 a gas compound supply pipeline, one end of which is connected to the storage vessel, and another end of which is capable of being disposed at the target location; and
 a temperature control device configured to adjust a temperature of the gas compound or the liquid compound within the storage vessel to be equal to or lower than a surrounding temperature of the gas compound supply pipeline, wherein the temperature control device is a device for cooling the storage vessel, the gas supply apparatus further comprising a casing or a housing chamber accommodating the storage vessel, the temperature control device, and the gas compound supply pipeline, and wherein the casing or the housing chamber comprises an air conditioning device configured to control a temperature of an interior space of the casing or the housing chamber.

\* \* \* \* \*